(12) United States Patent
Manor

(10) Patent No.: US 6,562,698 B2
(45) Date of Patent: May 13, 2003

(54) DUAL LASER CUTTING OF WAFERS

(75) Inventor: Ran Manor, Haifa (IL)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 89 days.

(21) Appl. No.: 09/864,620

(22) Filed: May 24, 2001

(65) Prior Publication Data

US 2001/0035401 A1 Nov. 1, 2001

Related U.S. Application Data

(63) Continuation-in-part of application No. 09/817,959, filed on Mar. 27, 2001, which is a continuation-in-part of application No. 09/327,722, filed on Jun. 8, 1999.

(51) Int. Cl.[7] .............................................. H01L 21/78
(52) U.S. Cl. ...................................................... 438/460
(58) Field of Search ................................ 438/460, 461, 438/462–465; 125/13.01

(56) References Cited

U.S. PATENT DOCUMENTS

| 4,543,464 A | 9/1985 | Takeuchi |
| 4,716,270 A | 12/1987 | Gnanamuthu et al. |
| 4,861,964 A | 8/1989 | Sinohara |
| 4,865,686 A | 9/1989 | Sinohara |
| 5,151,389 A | 9/1992 | Zapella |
| 5,185,295 A | 2/1993 | Goto et al. |
| 5,552,345 A | 9/1996 | Schrantz et al. |
| 5,922,224 A | * 6/1999 | Broekroelofs .......... 219/121.72 |
| 6,257,224 B1 | 7/2001 | Yoshino et al. |

FOREIGN PATENT DOCUMENTS

| EP | 0 818 818 A | 1/1998 |
| JP | 53033050 | 3/1978 |
| JP | 58036939 | 3/1983 |
| JP | 10321908 | 12/1998 |

* cited by examiner

Primary Examiner—David Nelms
Assistant Examiner—Thao Le
(74) Attorney, Agent, or Firm—RatnerPrestia

(57) ABSTRACT

A method for singulating semiconductor wafers comprises the steps of aiming a first and a second laser beam over a top surface of the substrate; forming scribe lines in the coating layer by scanning the first laser beam across the coating layer; and cutting through the substrate along the scribe lines with the second laser beam to form a respective kerf. The apparatus includes a first laser having a first wavelength placed over the coating layer of the substrate, and a second laser having a second wavelength different from that of the first laser placed over a surface of the substrate. The coating layer has a first absorption coefficient relative to a wavelength of the first laser and the semiconductor substrate has a second absorption coefficient less than the first absorption coefficient. Energy from the first laser beam is absorbed into the coating layer to form scribe lines therein, and the second laser beam cuts through the substrate along the scribe lines.

38 Claims, 12 Drawing Sheets

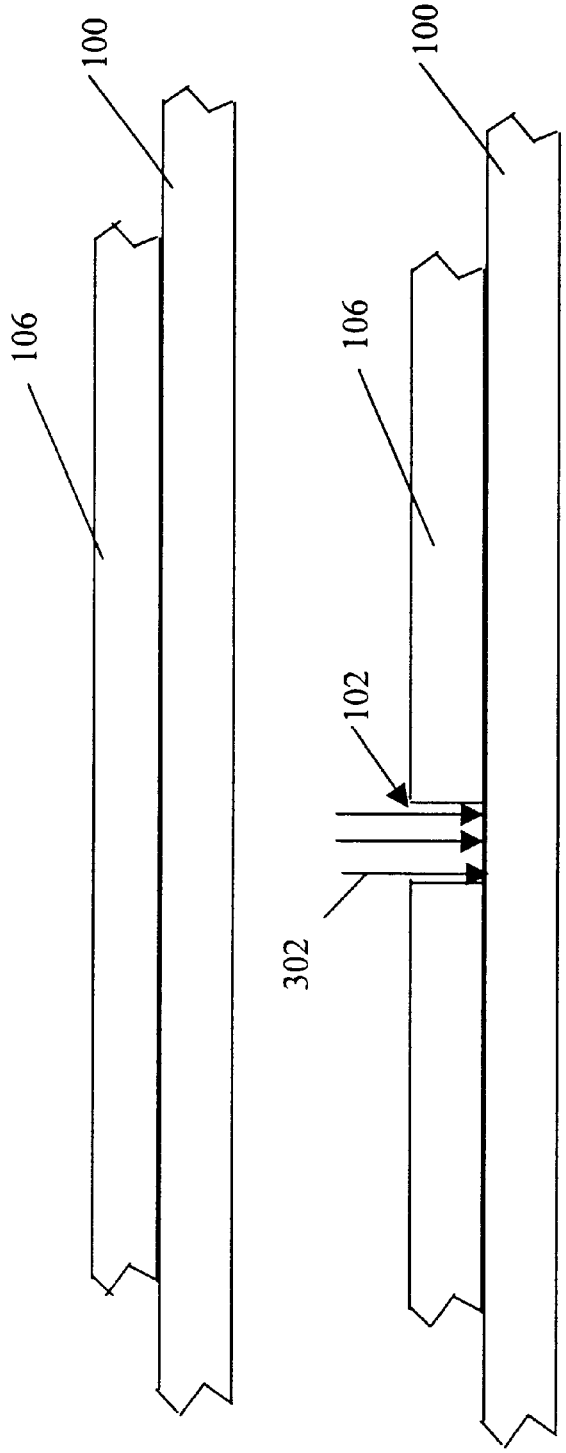
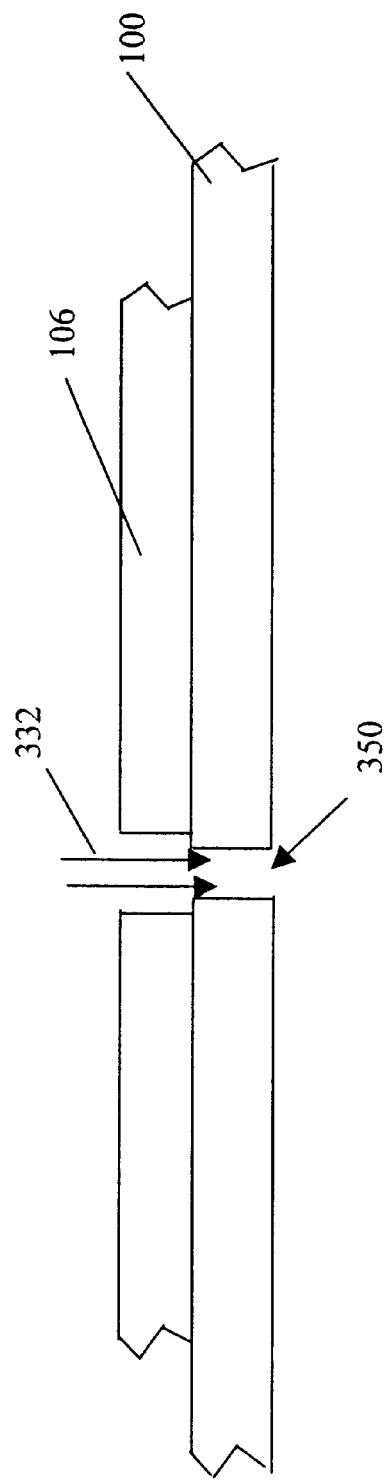

DUAL LASER CUTTING OF WAFERS

This application is a Continuation-in-Part of pending application Ser. No. 09/817,959 filed on Mar. 27, 2001, which is a Continuation-in-Part of pending application Ser. No. 09/327,722 filed on Jun. 8, 1999.

FIELD OF THE INVENTION

This invention relates generally to singulation of semiconductor wafers. More specifically, the present invention relates to a method and apparatus for a complete dual laser based cutting process of semiconductor wafers, where both laser frequencies are different from one another.

BACKGROUND OF THE INVENTION

Die separation, or singulation, by sawing is the process of cutting a microelectronic substrate into its individual circuit die with a rotating circular abrasive saw blade. This process has proven to be the most efficient and economical method in use today. It provides versatility in selection of depth and width (kerf) of cut, as well as selection of surface finish, and can be used to saw either partially or completely through a wafer or substrate.

Wafer dicing technology has progressed rapidly, and dicing is now a mandatory procedure in most front-end semiconductor packaging operations. It is used extensively for separation of die on silicon integrated circuit wafers.

Increasing use of microelectronic technology in microwave and hybrid circuits, memories, computers, defense and medical electronics has created an array of new and difficult problems for the industry. More expensive and exotic materials, such as sapphire, garnet, alumina, ceramic, glass, quartz, ferrite, and other hard, brittle substrates, are being used. They are often combined to produce multiple layers of dissimilar materials, thus adding further to the dicing problems. The high cost of these substrates, together with the value of the circuits fabricated on them, makes it difficult to accept anything less than high yield at the die-separation phase.

Dicing is the mechanical process of machining with abrasive particles. It is assumed that this process mechanism is similar to creep grinding. As such, a similarity may be found in material removal behavior between dicing and grinding. The size of the dicing blades used for die separation, however, makes the process unique. Typically, the blade thickness ranges from 0.6 mils to 50 mils (0.015 mm to 1.27 mm), and diamond particles (the hardest known material) are used as the abrasive material ingredient. Dicing saw blades are made in the form of an annular disc that is either clamped between the flanges of a hub or built on a hub that accurately positions the thin flexible saw blade. Because of the diamond dicing blade's extreme fineness, compliance with a strict set of parameters is imperative, and even the slightest deviation from the norm could result in complete failure.

FIG. 1 is an isometric view of a semiconductor wafer 100 during the fabrication of semiconductor devices. A conventional semiconductor wafer 100 may have a plurality of chips, or dies, 100a, 100b, . . . formed on its top surface. In order to separate the chips 100a, 100b, . . . from one another and the wafer 100, a series of orthogonal lines or "streets" 102, 104 are cut into the wafer 100. This process is also known as dicing the wafer.

IC wafers are coated with various layers such as passivation of oxides or nitrides, dielectrics, polymer coatings, and aluminum as well as copper metal pads (all collectively shown as 106 in FIG. 1). The wafer scribe lines (streets) reflect similar coatings on the chips, since all of the test devices and alignment marks are located within the scribe line borders. The wafer streets are therefore fully or partially coated with different materials and are largely non-homogeneous. This combination of materials has a significant effect on wafer dicing and die edge quality. When conventional dicing technology is used, such as a single blade and a single cut, the die edge on the bottom side of semiconductor wafer suffers severe backside chipping (BSC). In addition, on the topside of the wafer, problems at the die edge include cracking of the passivation and dielectric layers, the smearing or tearing of the metal pads, and the formation of polymer slivers.

One approach to overcome the aforementioned die edge problems is a mechanical dual dicing method. This method is a combination of two cuts (step cut), the first one being shallow and the second one being a through cut. The purpose of the first cut is to remove all the coatings 106 from the streets 102, 104 of semiconductor wafer 100 in order to permit a smooth through cut. The first cut, is performed using either a beveled blade or a standard blade that penetrates the silicon wafer as well. The removal of the coatings, passivation, dielectrics and metal pads 106 from the streets 102, 104 also affects the backside chipping. As a result, the size of chipping is reduced.

There are many disadvantages, however, to the step cut. First, the process throughput is reduced dramatically, since instead of one pass in the street, two passes are required. Second, the mechanical removal of the coatings creates residual cracks, which, in turn, cause further deterioration of the dice. Third, when the bevel blade wears out, the kerf gets wider and this requires frequent handling and replacement of the blade. Forth, the price of bevel blades is more expensive by a factor of five compared to a standard blade. All these drawbacks result in a high cost of ownership with regard to the step cut process.

There are other disadvantages regarding the beveled cut. Namely, blade penetration height must be carefully monitored, because for each one micron of penetration, the kerf widens by about two microns. In addition, the beveled blade may insert hidden damage into the die edge, in the form of cracks for example. Visual inspection of dice after dicing (an industry standard) is not capable of detecting this damage.

Additional disadvantages of using mechanical dicing include the cost and excessive wear of tools (saw) used to penetrate the substrate as well as the need for a cooling liquid during the cutting operation. In addition, the use of saw blades limits the form factor of the resulting die to having linear patterns, such as squares, rectangles, etc.

In view of the shortcomings of the prior art, there is a need to develop a method and apparatus to cut die having various coating layers and test structures in the wafer scribe lane so as to increase throughput, minimize the backside chipping, increase the mechanical stability of thin wafers, reduce tool wear, eliminate the need for cooling liquids, enable the formation of die having non-linear edge patterns, and increase the yield of useable circuits.

SUMMARY OF THE INVENTION

In view of the shortcomings of the prior art, it is an object of the present invention to optimize the dicing process and minimize bottom side chipping (BSC) of semiconductor wafers.

The present invention is a method and apparatus for cutting a semiconductor substrate by focusing a first laser beam having a first frequency over a top surface of the substrate; forming scribe lines in the layer with the first laser beam; focusing a second laser beam having a second frequency different from that of the first laser source over a top surface of the substrate; and cutting the substrate by scanning the second laser beam along the scribe lines formed by the first laser beam.

According to another aspect of the invention, the substrate is cut through with the second laser beam.

According to still another aspect of the invention, the substrate is scribed along the surface with the first laser before the substrate is cut with the second laser.

According to yet another aspect of the invention, the diameter of the first laser beam is greater than the diameter of the second laser beam.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIGS. 4A–4C are side view illustrations showing formation of scribe lines and cut lines according to an exemplary embodiment of the present invention;

DETAILED DESCRIPTION

Figure 1:
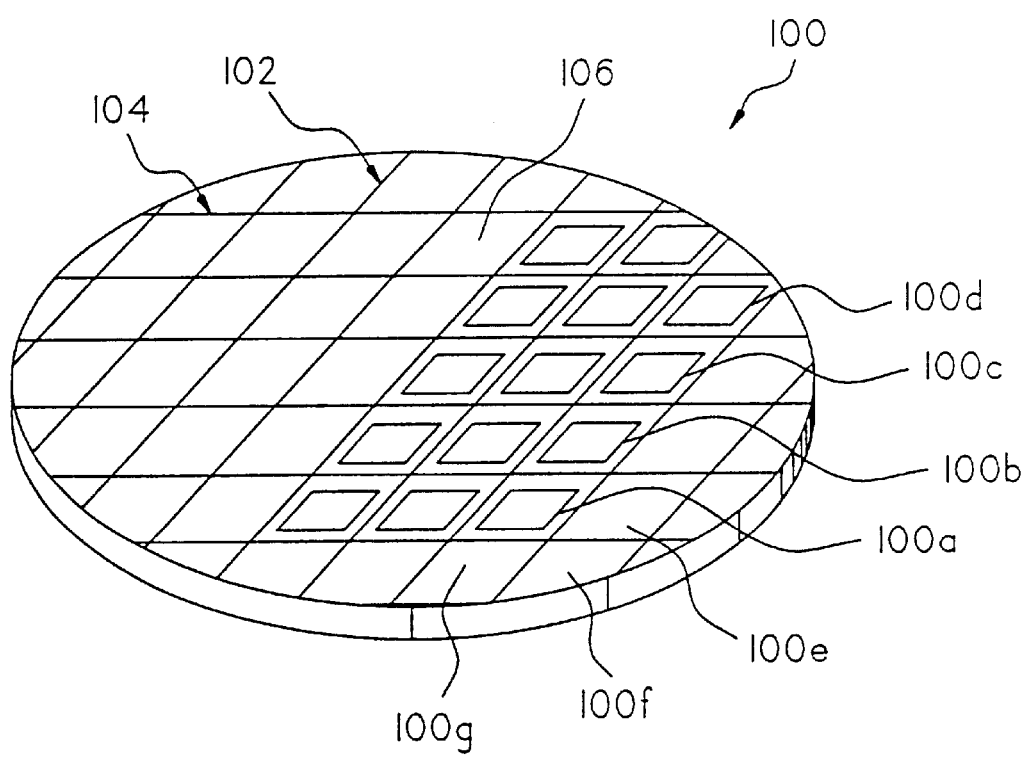
FIG. 1 is an isometric view of a semiconductor wafer used to form semiconductor devices.

In the manufacture of semiconductor devices, individual chips are cut from a large wafer using a very high speed rotating saw blade. In essence, the saw blade grinds away a portion of the wafer along linear streets or kerfs (102, 104 as shown in FIG. 1) in one direction followed by a similar second operation in an orthogonal direction.

The quality of the dice (chips) is directly related to the minimization of chipping (front and back) during the dicing operation. The inventor has determined that by removing all the layers on top of the silicon substrate using a non-mechanical approach, in the area where the substrate will be cut through, throughput is dramatically increased (by about a factor of two), front side chipping (FSC) is significantly reduced (if not completely eliminated), BSC is minimized, and device yield is increased as well.

Figure 2:
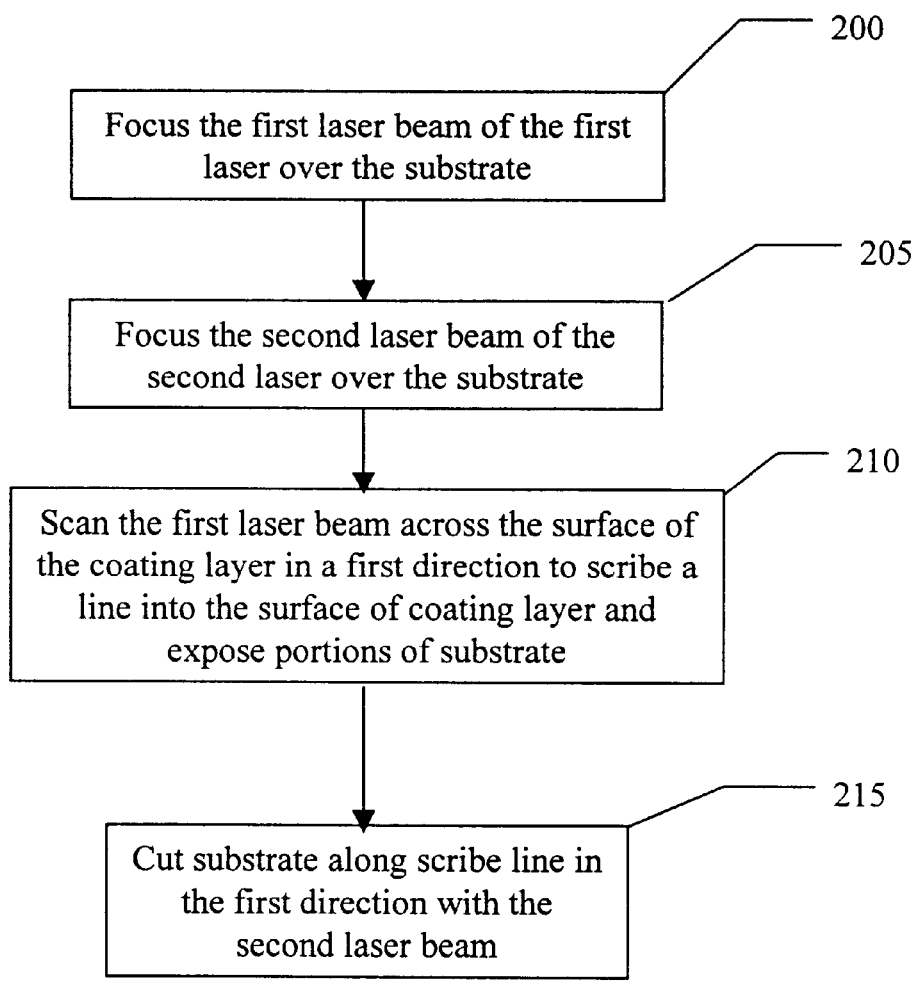
FIG. 2 is a flow chart of a first exemplary method of the present invention.
Figure 3A:
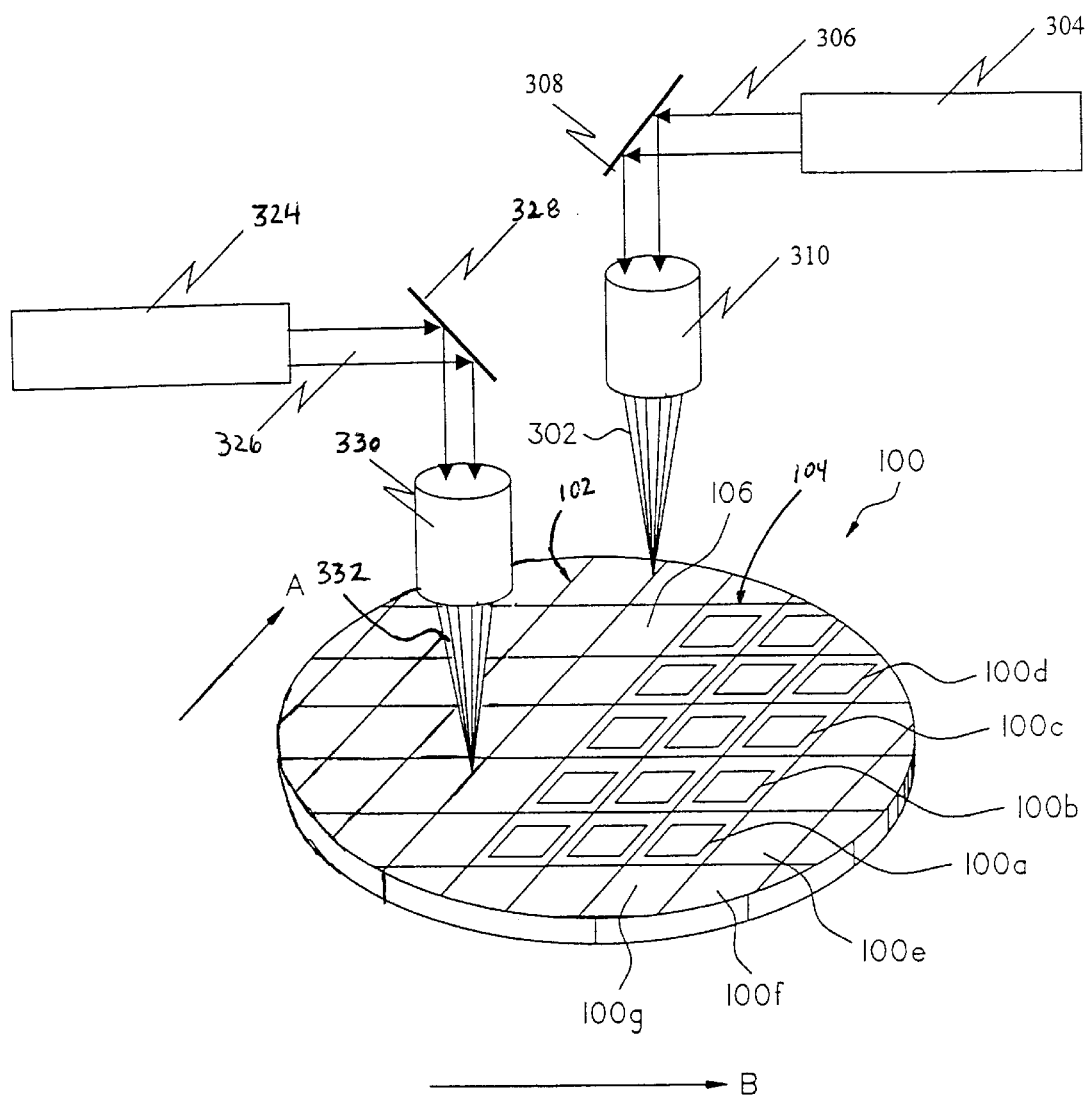
FIGS. 3A and 3B are diagrams of a first exemplary embodiment of the present invention.
Figure 3B:
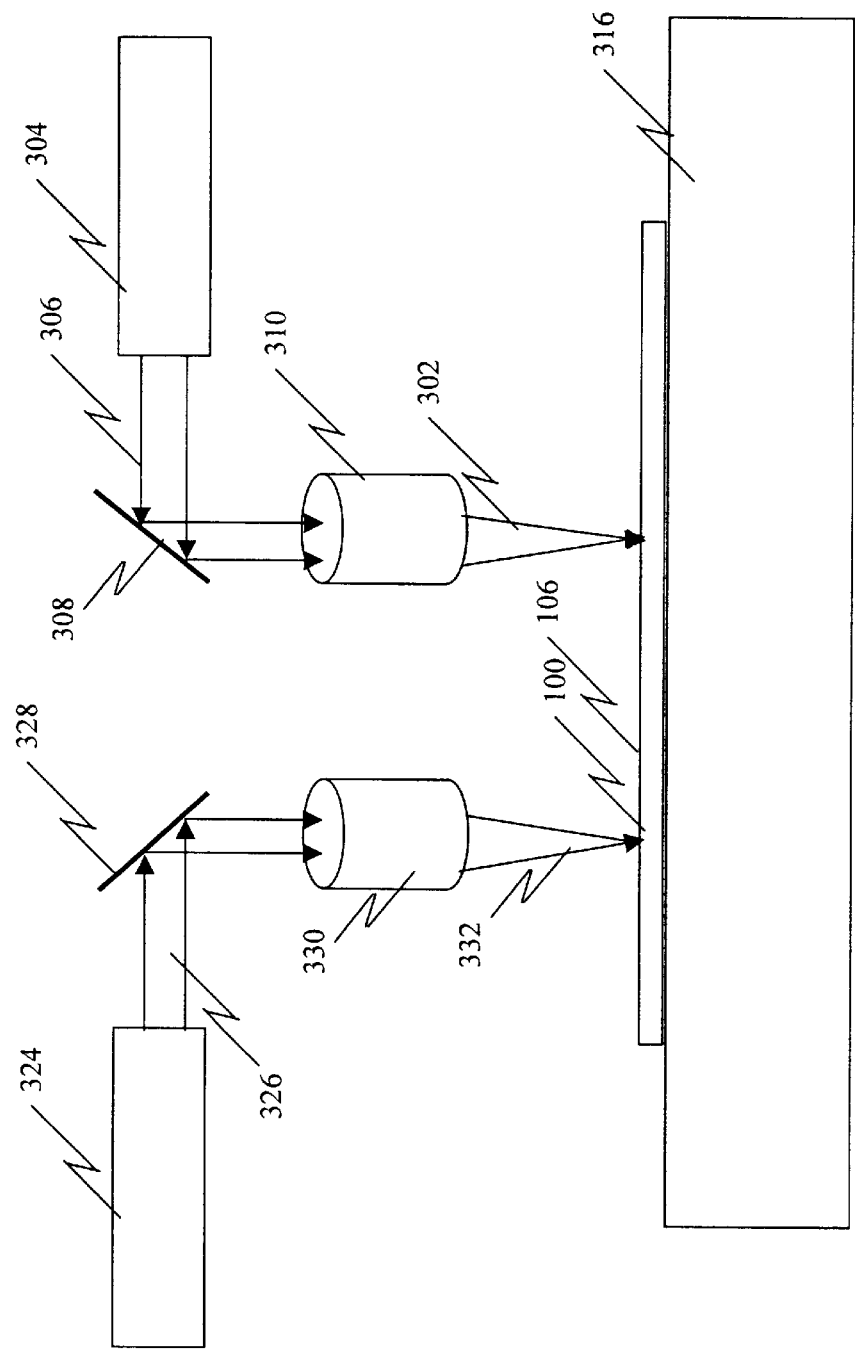

Referring to FIG. 2, a flow chart of an exemplary embodiment of the present invention is shown. Referring to FIGS. 3A and 3B, the exemplary wafer singulating apparatus is shown and referring to FIGS. 4A–4C formation of scribe lines and cut lines are shown.

In FIG. 2, at Step 200, laser beam 306 from first laser source 304 (shown in FIGS. 3A and 3B) is directed by folding mirror 308 and focused by lens 310 as first focused laser beam 302 onto coating layers 106 which overlie the surface of the substrate 100. The frequency of first focused laser beam 302 is subject to the physical constraint that its absorption coefficient in coating layers 106 is much larger, by an order of magnitude, than the absorption coefficient of the substrate 100. It should be noted that first focused laser beam 302 might also be focused at a point above or below the surface of coating layers 106 or substrate 100. As shown in FIG. 4A, prior to directing first focused laser beam 302 at coating layers 106, the coating layers overlie the surface of substrate 100.

Referring again to FIG. 2, at Step 205, second laser beam 326 from second laser source 324 (shown in FIGS. 3A and 3B), having a wavelength different from that of first focused laser beam 306, is directed by folding mirror 328 and focused by lens 330 as second focused beam 322 onto the surface of the substrate 100. The frequency of second focused laser beam 322 is subject to the physical constraint that it is absorbed in substrate 100. At Step 210, focused laser beam 302 is scanned across the surface of the substrate coating layers 106 (in direction A for example) to remove layers 106 by evaporation and form desired scribe lines 102 (shown in FIG. 4B). At Step 215, focused laser beam 322 is scanned along the previously formed scribe line 102, 104 to penetrate substrate 100 and form cut 350 coincident with and bounded by the scribe lines (shown in FIG. 4C), in turn forming dies 100a, 100b, etc.

Although direction A (shown in FIG. 3A) is illustrated to be essentially linear, the exemplary embodiment is not limited to linear scribing and cutting. Because the first exemplary embodiment does not rely upon saw blades to cut the substrate, the scribing and cutting may have nonlinear patterns, such as circles, ellipses, or portions thereof, for example.

The coating layers 106 on top of the surface of substrate 100 are a combination of passivation layers, dielectrics, oxides, nitrides and metal pads. In most standard ICs, the total thickness of all these layers is usually less than 20 microns. The individual thickness of each layer is usually less than one micron, with the exception of the polymer layer having a thickness of few microns. The optical properties, such as absorption, reflection, and index of refraction of these layers are very different from one layer to another and from that of the silicon substrate.

One of the major concerns when processing IC wafers with laser irradiation is the high sensitivity of the device to heating and thermal damage. Excessive heating of the substrate can reduce device performance, reliability and even cause instant device failure. It is therefore necessary when scribing to use an appropriate range of laser frequencies that are strongly absorbed in the coating layers, but with minimal absorption within the substrate. One of the most suitable lasers for the suggested scribing process in this embodiment is the $CO_2$ laser irradiating in the far infrared region of the spectrum at a wavelength of about 10.6 microns, for example. The absorption coefficient of the $CO_2$ laser energy by silicon is practically zero, and is considerably lower (by about an order of magnitude, i.e. a factor of 10, and preferably at least an order of magnitude) than the absorption coefficient of the coating layers. On the contrary, silicon heavily absorbs (absorption coefficient of $10^6$ $cm^{-1}$) energy in the UV range of the spectrum, such as a wavelength of about 200 nm. Laser energy sources, such as Excimer (UV) laser sources, described in the prior art to process silicon (U.S. Pat. No. 5,151,389 to Zappella, and U.S. Pat. No. 5,552,345, Schrantz et al.) are examples of sources whose energy is readily absorbed by silicon. Nevertheless, the use of lasers emitting energy in the UV frequency range can significantly damage the silicon wafer, while the present embodiment overcomes this major deficiency by using laser radiation that is not absorbed by the silicon substrate while scribing the coatings. The silicon cannot be heated directly by far infrared laser radiation, while the upper coatings over the silicon substrate are partially or completely removed by the $CO_2$ laser beam due to the much larger absorption coefficient of the layers relative to that of the silicon substrate. A similar approach is being used in the well known process of etching, where a stop etch layer is used to increase process robustness, accuracy, and to protect other layers. In the aforementioned embodiment, the silicon substrate acts as a stop etch layer for the laser irradiation. In U.S. Pat. No. 4,716,270 to Gnanamuthu et al. totally different physics are used to differentiate between laser processing of two layers of material. In Gnanamuthu et al. the workpiece is a metal coated with an organic polymer, and the differentiation between the laser processing on the two layers is based on a reflection principle, in which the laser radiation is highly reflected from the underlying metal substrate. By contrast, the exemplary embodiment of the present invention is capable of removing thin metal layers on top of the wafer substrate, despite their high reflectivity to the laser radiation. This is possible because the exemplary process is based on absorption of the laser energy rather than reflection.

In an exemplary embodiment of the present invention, focused laser beam 302, used to scribe substrate 100, is about 50 μm in diameter, although other diameters may be used as necessary. As shown in FIGS. 4B and 4C, the diameter (or focal spot size) of focused laser beam 302 (used to scribe the coating layer 106) should preferably be larger than that of focused laser beam 332 (used to subsequently cut the underlying substrate). As shown in FIG. 4B, in forming streets 102, 104, focused laser beam 302 removes only the layers 106 on top of the silicon substrate resulting in minimal indirect heating of the underlying silicon substrate 100.

Referring again to FIGS. 4A–4C, layer 106 is usually about 10 microns thick while the silicon wafer can have a thickness many times that of the coating, and typically can vary between about 100–750 microns, although 30 microns thick wafers are demonstrated as well. In addition, the edges of the laser scribe lines and cut lines shown in FIGS. 4B and 4C are merely illustrative, and in reality are not as sharp and well defined as drawn.

In an exemplary embodiment, laser sources 304 and 324 (and associated components) are stationary while the substrate 100 is moved in direction A, for example, using a conventional X-Y table 316 onto which the substrate 100 is mounted (by vacuum for example), to form streets 102. As each street 102 is completed, substrate 100 is translated in direction B by X-Y table 316 and the process is repeated for an additional street 102.

After all of the streets 102 are formed, the substrate 100 may be rotated by about 90° so that the process may be repeated to form streets 104 in substrate 100. Alternatively, the lasers may be moved relative to a stationary substrate 100 in either or both the X and Y directions.

One major advantage of laser scribing/laser cutting is that it may be performed at a much higher feed rate than the conventional step cut dicing process to remove the top layers over the substrate and singulate the substrate. The latter is particularly significant when thin substrates are singulated.

Figure 5A:
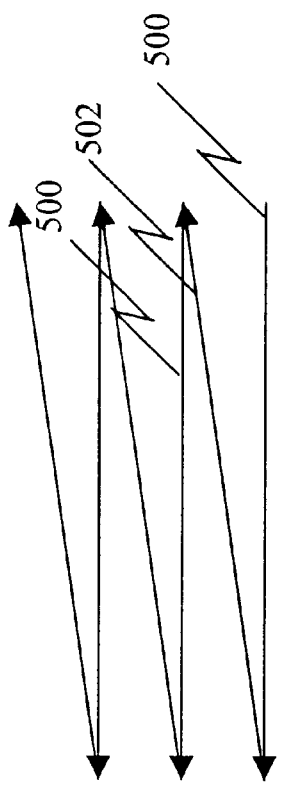
FIG. 5A is an illustration of saw blade motion used in conventional dicing.
Figure 5B:
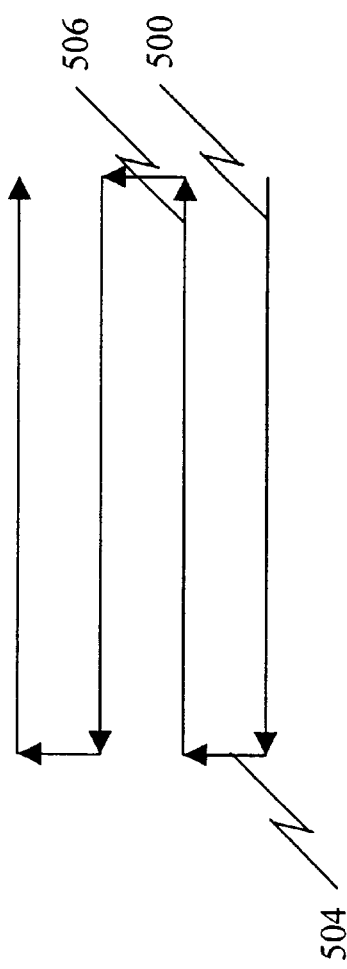
FIG. 5B is an illustration of the laser beam motion of an exemplary embodiment of the present invention.

Another advantage of the exemplary laser scribing process over conventional dicing is represented in FIGS. 5A and 5B. While dicing with a saw blade, the blade needs to penetrate the wafer from a particular direction (motion 500, shown in FIG. 5A). Therefore, in order to make successive cuts, the blade motion has a zigzag form as shown in FIG. 5A (motion 500 followed by motion 502, etc.) This approach is time consuming, however, since during the return time (motion 502) the blade can not cut. By contrast, according to the exemplary embodiment of the present invention, since the laser scribing/cutting is a contact-less process the lasers can operate in both directions (staggered mode) as is shown in FIG. 5B (scribing/cutting motion 500, followed by lateral motion 504, followed by scribing/cutting motion 506, etc.) Therefore, the only non-scribing/cutting time is during motion lateral 504 from a cutting street to the next cutting street.

Yet another advantage of the laser scribing/laser cutting over the step-bevel cut is eliminating the need for expensive blades, and allowing the possibility of sealing the passivation layer using the scribing laser beam, thereby avoiding crack formation.

In the exemplary embodiment two different type of laser sources (laser heads) are used. The first laser source 302 is used for scribing and is a $CO_2$ laser having a wavelength ranging between about 9 and 11 microns, and preferably having a wavelength of about 9.3 or 10.6 microns. The second laser source 322 is used for cutting and may be Nd: YAG, operating mainly at its primary wavelength (1.06 microns).

Although an Nd: YAG laser operating at its fundamental frequency of 1.06 microns may be used as second laser source 322 for singulating substrate 100, other types of lasers may be used to perform the through cut. Examples are an Nd: YAG laser operating at harmonics of its fundamental frequency, such as the second harmonic—532 nm, third harmonic—355 nm and the forth harmonic—266 nm, a Ti-sapphire laser operating in the red and near infrared range of the spectrum, such as about 780 nm, an Ar ion laser operating in the visible range of the spectrum, semiconductor diode lasers, such as a AlGaAs diode laser emitting radiation in the near infrared range of the spectrum, 808 nm for example, and Excimer lasers operating in the UV regime of the spectrum, such as ArF-193 nm, KrF-248 nm, XeCl-308 nm, and XeF-351 nm, for example.

Since the feed rate for the through cut process is dependent on the substrate thickness, it is contemplated that the feed rate of the substrate relative to the scribing and cutting lasers may be at least 0.1 in/sec and may be as high as 40 in/sec. Moreover, the feed rates may be different for the two distinct processes, namely, the scribing process being performed at a first feed rate while the second (through cut) process is performed at a second feed rate that may differ from the first feed rate. Furthermore, instead of a $CO_2$ laser for scribing, other wavelengths of laser irradiation may be used such that their absorption within the coating layers 106 is significantly higher (by about at least an order of magnitude based on the wavelength of the laser) than that of the substrate. It is contemplated that lasers having wavelengths between about 1.2 and 15 microns may be used for scribing the coating layers 106, preferably between about 9 and 11 microns, and most preferably about 9.3, 9.6 or 10.6 microns.

It is also contemplated that various power levels of scribing and cutting lasers may be used as desired. For example, powers as low as 1 Watt up to 40 Watts may be used as desired to achieve high kerf quality. Cutting kerf width is subject to changes as well, as long as its size is smaller than that of the scribe line performed by the first scribing laser (See FIG. 4C). The kerf width of the cutting laser may be as wide as 100 μm down to less than 5 μm.

Figure 6:
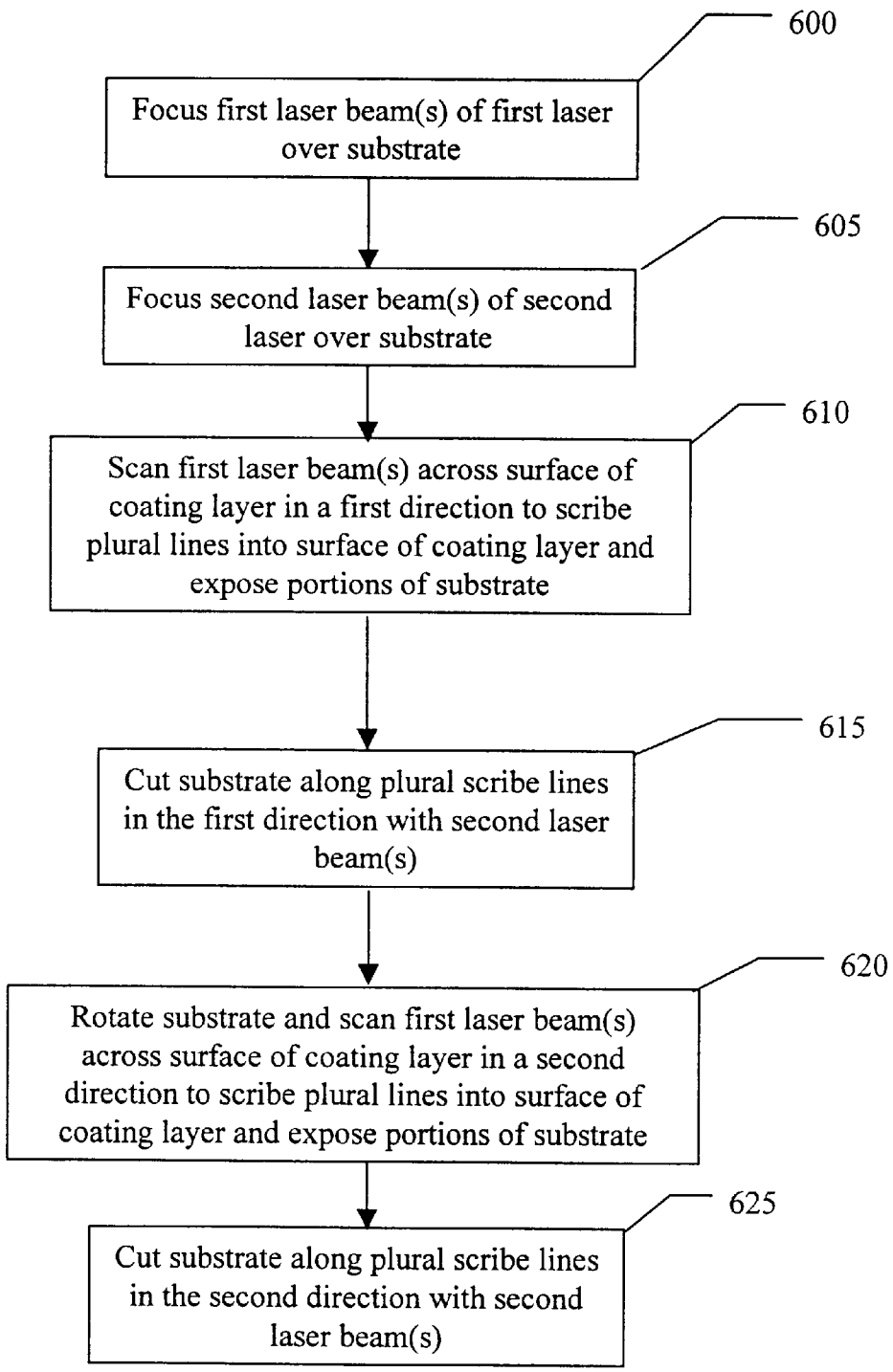
FIG. 6 is a flow chart of a second exemplary method of the present invention.

Referring to FIG. 6, a flow chart of a second exemplary process is illustrated in accordance with the first exemplary apparatus shown in FIGS. 3A and 3B. At Step 600, scribing laser beam 306 from first laser source 304 is directed by folding mirror 308 and focused by lens 310 as first focused beam 302 onto substrate 100. At Step 605, laser beam 326 from second laser source 324 is directed by folding mirror 30 328 and focused by lens 330 as second focused beam 332 onto substrate 100. As in the first exemplary embodiment, focused laser beams 302, 332 may also be focused at a point above or below the surface substrate 100. At Step 610, first focused laser beam 302 is repeatedly scanned across the surface of substrate coating layers 106 to remove portions of all layers 106 by evaporation and form scribe lines 102 (one scan across substrate 100 for each scribe line). At Step 615, substrate 100 is cut by penetrating substrate 100 along scribe lines 102 with second focused laser beam 332. At Step 620, substrate 100 is rotated (preferably by 90°) and first focused laser beam 302 is again repeatedly scanned across the surface of substrate coating layers 106 to remove portions of all layers 106 by evaporation and form scribe lines 104. At Step 625, substrate 100 is cut by penetrating substrate 100 along scribe lines 104 with second focused laser beam 332 to form dies 100a, 100b, etc.

Figure 7:
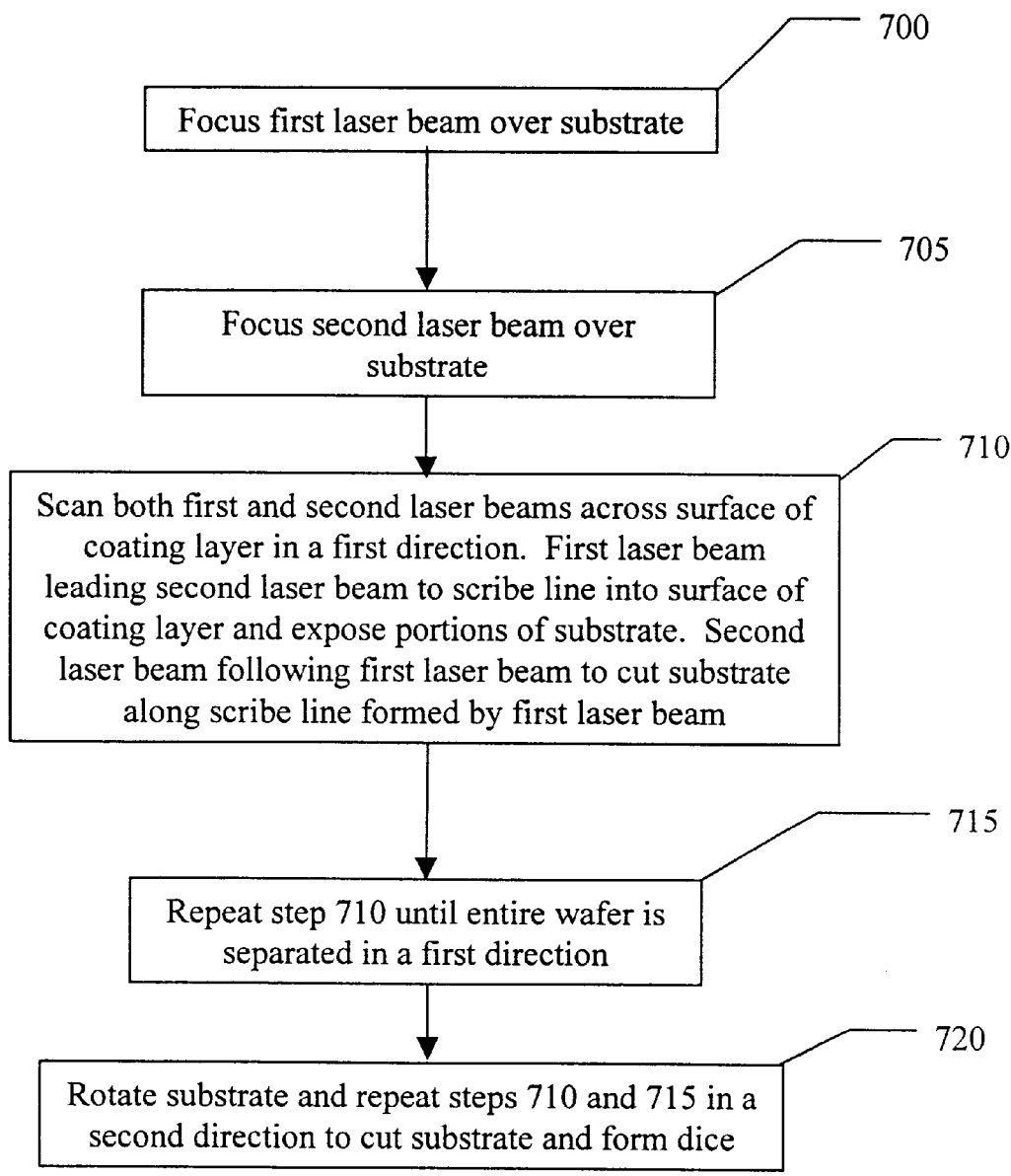
FIG. 7 is a flow chart of a third exemplary method of the present invention.

Referring to FIG. 7, a flow chart of a third exemplary process is illustrated in accordance with the first exemplary apparatus shown in FIGS. 3A and 3B. At Step 700, scribing laser beam 306 from first laser source 304 is directed by folding mirror 308 and focused by lens 310 as first focused beam 302 onto substrate 100. At Step 705, laser beam 326 from second laser source 324 is directed by folding mirror 328 and focused by lens 330 as second focused beam 332 onto substrate 100. As in the first and second exemplary embodiments, focused laser beams 302, 332 may also be focused at a point above or below the surface substrate 100. At Step 710, focused laser beam 302 is scanned across the surface of substrate coating layers 106 in a first direction (such as direction A shown in FIG. 3A) to remove portions of all layers 106 by evaporation and form scribe lines 102 (one scan across substrate 100 for each scribe line). At the same time, second focused laser beam 332 closely follows behind first focused laser beam 302, along just formed scribe line 102, to cut substrate 100 by penetrating substrate 100 along scribe line 102 with second focused laser beam 332. At Step 715, the process of Step 710 is repeated forming further scribe/cut lines until the entire substrate 100 is separated in the first direction. At Step 720, substrate 100 is rotated (preferably by 90°) and focused laser beams 302, 322 are again repeatedly scanned across the surface of substrate coating layers 106 to scribe and cut substrate 100 similar to Steps 710, 715, to form dies 100a, 100b, etc.

Figure 8:
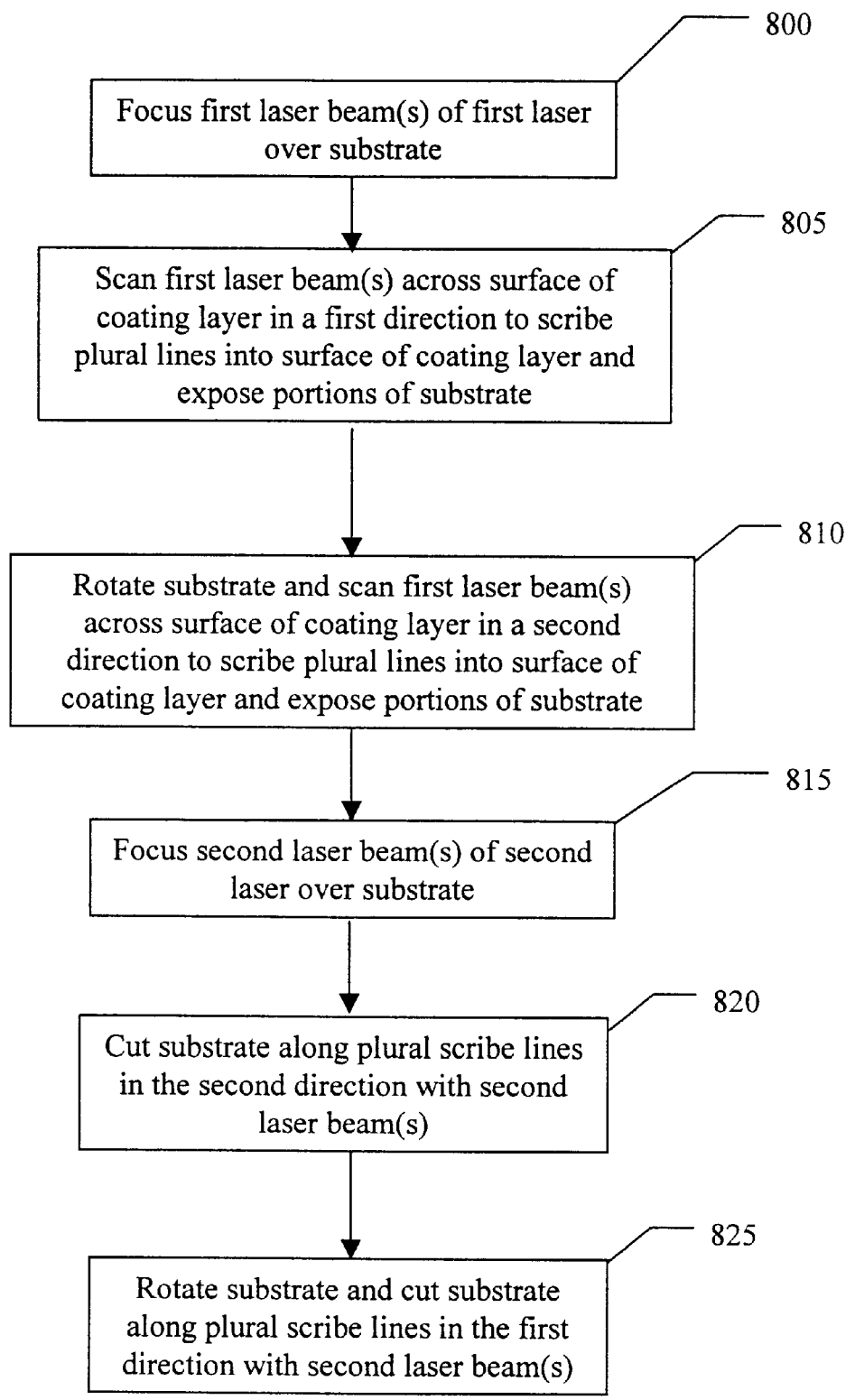
FIG. 8 is a flow chart of a fourth exemplary method of the present invention.

Referring to FIG. 8, a flow chart of a fourth exemplary process is illustrated in accordance with the first exemplary apparatus shown in FIGS. 3A and 3B. At Step 800, laser beam 306 from first laser source 304 is directed by folding mirror 308 and focused by lens 310 as first focused beam 302 onto substrate 100. At Step 805, first focused laser beam 302 is repeatedly scanned across the surface of substrate coating layers 106 to remove portions of all layers 106 by evaporation and form scribe lines 102 (one scan across substrate 100 for each scribe line). At Step 810, substrate 100 is rotated (preferably by 90°) and first focused laser beam 302 is again repeatedly scanned across the surface of substrate coating layers 106 to remove portions of all layers 106 by evaporation and form scribe lines 104. At Step 815, laser beam 326 from second laser source 324 is directed by folding mirror 328 and focused by lens 330 as second focused beam 322 onto substrate 100. At Step 820, substrate 100 is cut by penetrating substrate 100 along scribe lines 104 with second focused laser beam 332. At Step 825, substrate 100 is rotated to its original position and cut by penetrating substrate 100 along scribe lines 102 with second focused laser beam 332 to form dies 100a, 100b, etc.

Figure 9:
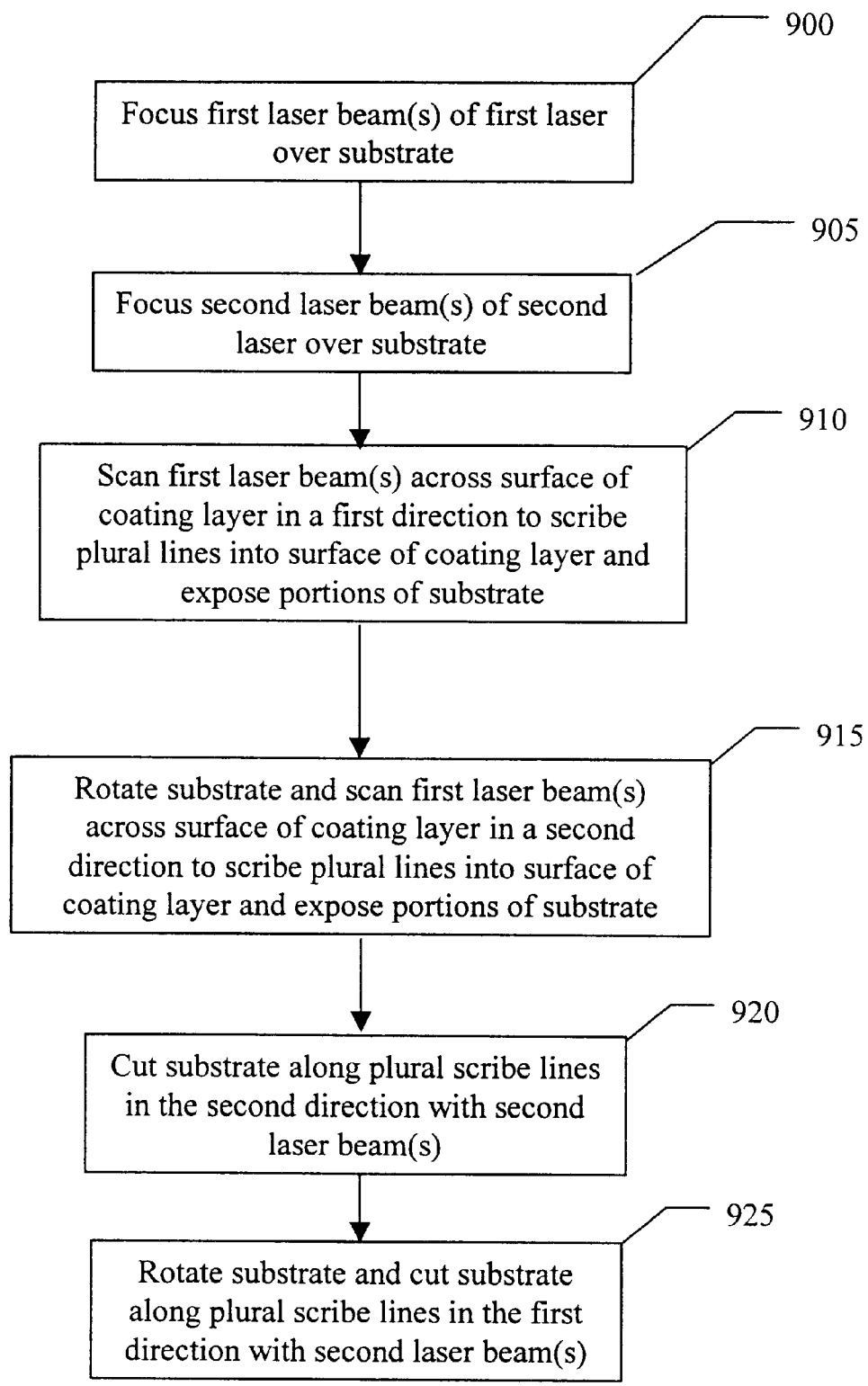
FIG. 9 is a flow chart of a fifth exemplary method of the present invention.

Referring to FIG. 9, a flow chart of yet another exemplary process is illustrated in accordance with the first exemplary apparatus shown in FIGS. 3A and 3B. At Step 900, laser beam 306 from first laser source 304 is directed by folding mirror 308 and focused by lens 310 as first focused beam 302 onto substrate 100. At Step 905, laser beam 326 from second laser source 324 is directed by folding mirror 328 and focused by lens 330 as second focused beam 322 onto substrate 100. At Step 910, first focused laser beam 302 is repeatedly scanned across the surface of substrate coating layers 106 to remove portions of all layers 106 by evaporation and form scribe lines 102. At Step 915, substrate 100 is rotated (preferably by 90°) and first focused laser beam 302 is again repeatedly scanned across the surface of substrate coating layers 106 to remove portions of all layers 106 by evaporation and form scribe lines 104. At Step 920, substrate 100 is then cut by penetrating substrate 100 along scribe lines 104 with second focused laser beam 332. At Step 925, substrate 100 is rotated to its original position and cut by penetrating substrate 100 along scribe lines 102 with second focused laser beam 332 to form dies 100a, 100b, etc.

Figure 10:
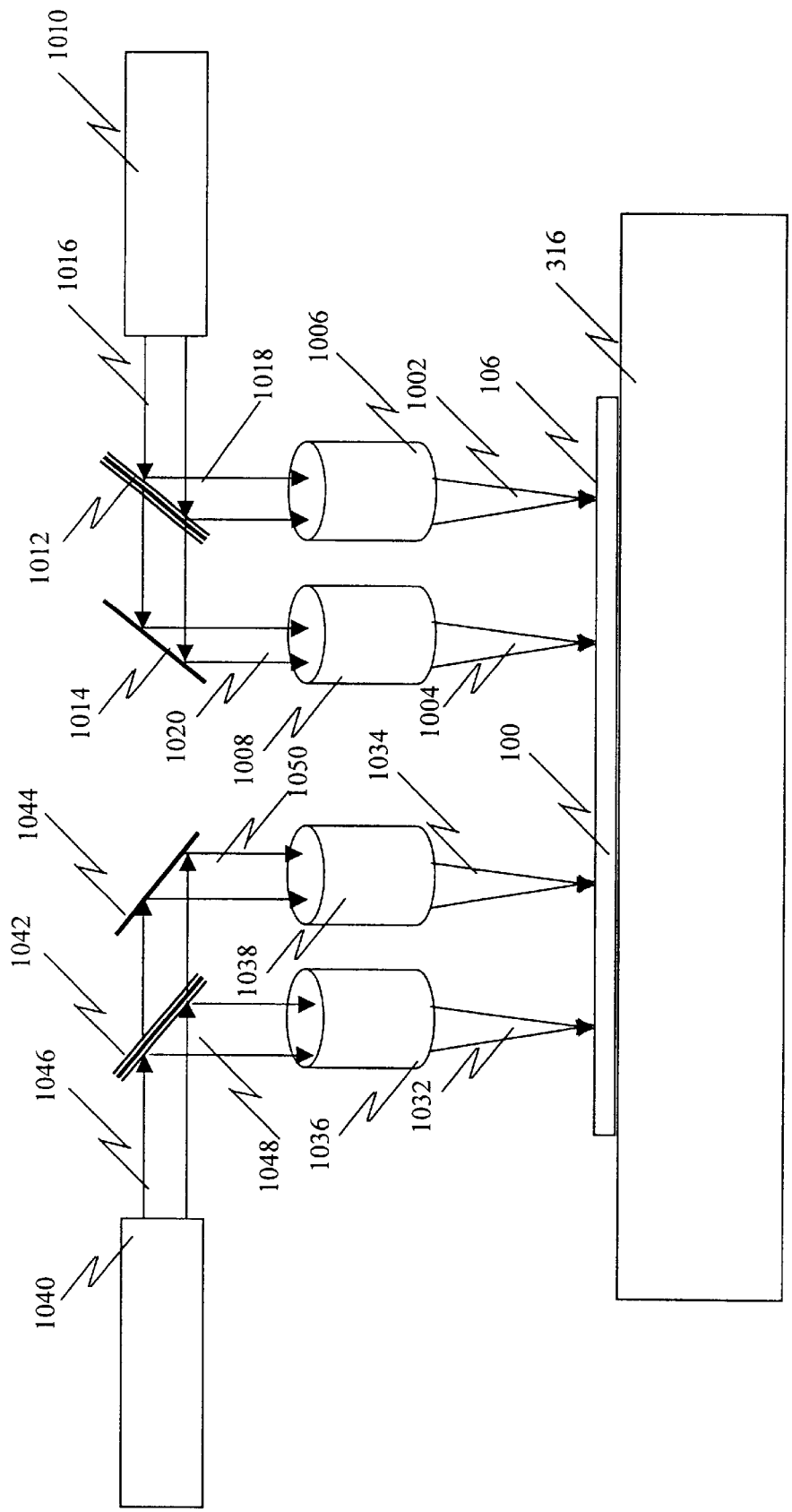
FIG. 10 is a diagram of a second exemplary embodiment of the present invention.

FIG. 10 illustrates a second exemplary embodiment of the present invention. As shown in FIG. 10, a single laser source 1010 having about twice the power of laser source 304 is used to generate scribing laser beam 1016, which is then split into two essentially identical laser beams 1018 and 1020 with beam splitter 1012. Laser beams 1018 and 1020 are then used to generate focused laser beams 1002 and 1004, respectively, for scribing coating layer 106, according to the processes described above to form respective scribe lines. As in the first exemplary embodiment, folding mirror 1014 and focusing lenses 1006, 1008 are used in the generation of focused laser beams 1002 and 1004. Similarly, a single laser source 1040 having about twice the power of laser source 324 is used to generate cutting laser beam 1046, which is then split into two essentially identical laser beams 1048 and 1050 with beam splitter 1042. Laser beams 1048 and 1050 are then used to generate focused laser beams 1032 and 1034, respectively, for cutting substrate 100 along respective ones of the previously formed scribe lines, according to the various processes described above. This exemplary embodiment has the added advantage of about twice the throughput of the first exemplary embodiment in that multiple scribe lines are formed in a single pass, followed by a higher rate of singulation with the multiple cutting beams.

Figure 11:
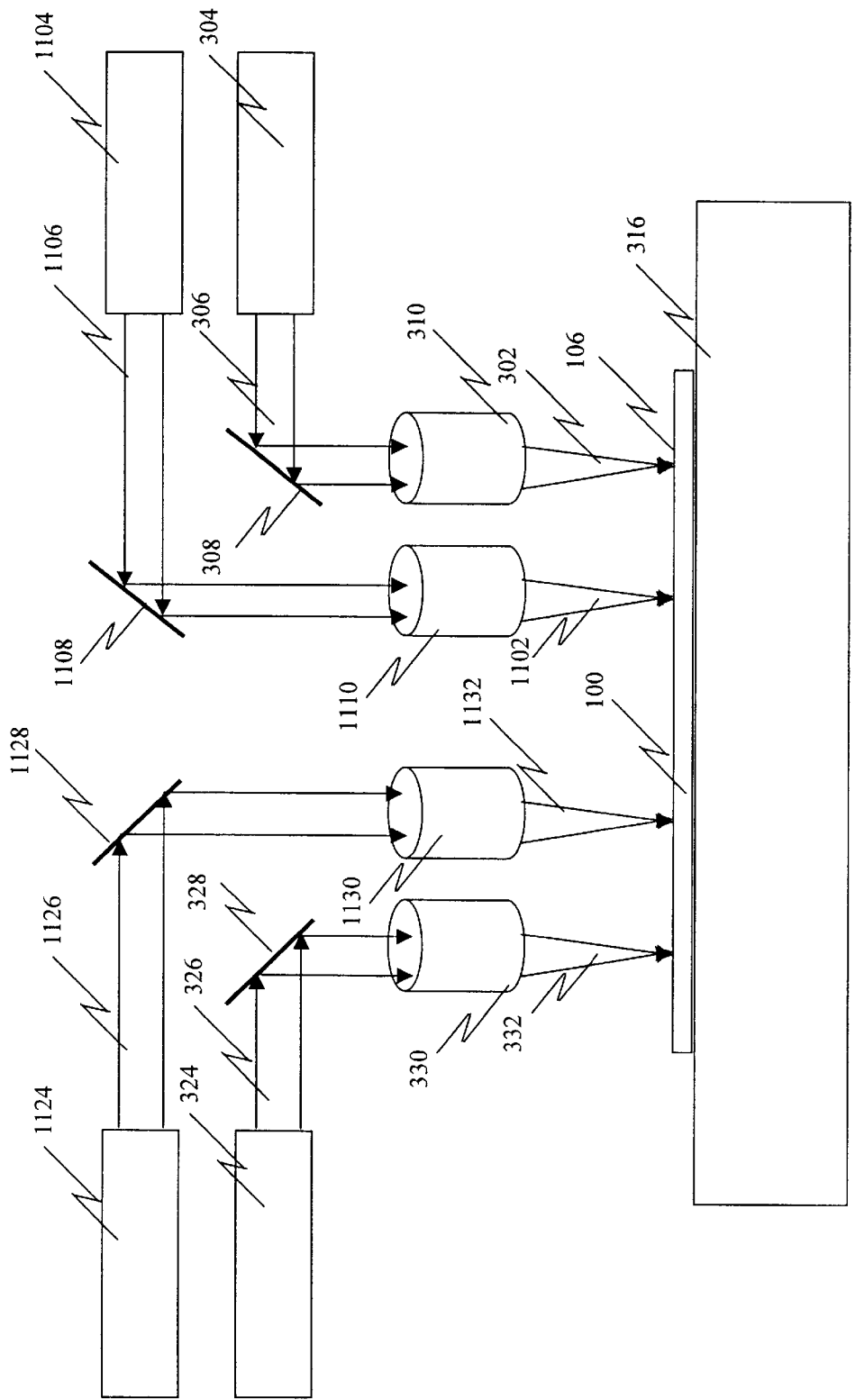
FIG. 11 is a diagram of a third exemplary embodiment of the present invention.

FIG. 11 illustrates yet another exemplary embodiment of the present invention. In FIG. 11, instead of using a single laser source to generate multiple scribing or cutting laser beams (as shown in FIG. 10), a single laser source is used for each of the multiple laser beams. As shown in FIG. 11, the generation of scribing laser 302 and cutting laser 332 is the same as in the first exemplary embodiment shown in FIGS. 3A and 3B, and therefore a description of the elements is not repeated here. As is also shown in FIG. 11, laser beam 1106 from a second scribing laser 1104 is directed by folding mirror 1108 and focused by lens 1110 as focused scribing laser beam 1102 onto coating 106 overlying the surface of the substrate 100. In addition, laser beam 1126 from second cutting laser 1124 is directed by folding mirror 1128 and focused by lens 1130 as focused beam 1122 onto the surface of the substrate 100.

In FIGS. 10 and 11, although for ease of illustration the scribing and cutting laser beams are illustrated alongside one another, the invention is not so limited. The arrangement of the cutting and scribing lasers and associate elements may be such that a pair of scribing and cutting laser beams are configured in-line with one another so that one cutting laser beam follows a respective scribing laser beam. It is also possible to arrange the scribing and cutting lasers such that the first scribing/cutting laser pair are used on about half of the substrate while a second scribing/cutting laser pair are simultaneously used on a remainder of the substrate. In addition, it is also possible to arrange the scribing and cutting lasers such that the first scribing/cutting laser pair are used to scribe and cut every other line (such as the odd numbered lines) and the second scribing/cutting laser pair are used to scribe and cut the intermediate lines (such as the even numbered lines).

Although the invention has been described with reference to exemplary embodiments, it is not limited thereto. Rather, the appended claims should be construed to include other variants and embodiments of the invention, which may be made by those skilled in the art without departing from the true spirit and scope of the present invention.

What is claimed:

1. A method for singulating a semiconductor substrate having a coating layer, the method comprising the steps of:
    (a) aiming a first laser beam having a first frequency and a second laser beam having a second frequency different from the first frequency over a top surface of the substrate;
    (b) forming scribe lines in the coating layer by scanning the first laser beam across the coating layer, the first laser beam removing at least a portion of the coating layer; and
    (c) cutting through the substrate along the scribe lines with the second laser beam to form a respective kerf.

2. The method according to claim 1, wherein a focal spot size of the first laser beam is greater than a focal spot size of the second laser beam.

3. The method according to claim 1, wherein a width of the scribe line is greater than a width of the kerf.

4. The method according to claim 1, wherein at least one of the scribe lines is curved.

5. The method according to claim 1, wherein the scribe lines are substantially straight.

6. The method according to claim 1, wherein a wavelength of the first laser is between about 1.2 and 15 microns and a wavelength of the second laser is between about 1.06 microns and 193 nm.

7. A method for singulating a semiconductor substrate having a coating layer, the method comprising the steps of:
    (a) aiming a first and a second laser beam over a top surface of the substrate;
    (b) forming a first set of scribe lines in a first direction in the layer by scanning the first laser beam across the layer, the first laser beam removing at least a portion of the layer;
    (c) forming a second set of scribe lines in a second direction in the layer by scanning the first laser beam across the layer and removing at least a portion of the layer with the first laser beam;
    (d) cutting through the substrate along the second set of scribe lines with the second laser beam to form a respective first set of kerfs; and
    (e) cutting through the substrate along the first set of scribe lines with the second laser beam to form a respective second set of kerfs.

8. The method according to claim 7, wherein the second direction substantially orthogonal to the first direction.

9. The method according to claim 7, wherein the first laser emits infrared radiation having a wavelength greater than 1.1 microns and the second laser emits radiation having a wavelength less than 1.1 microns.

10. The method according to claim 9, wherein a wavelength of the first laser is between about 1.2 and 15 microns.

11. The method according to claim 9, wherein the wavelength of the first laser is between about 9 and 11 microns.

12. The method according to claim 9, wherein the wavelength of the first laser is one of i) 9.3, ii) 9.6 and iii) 10.6 microns.

13. The method according to claim 9, wherein a wavelength of the second laser is between about 1.06 microns and 193 nm.

14. The method according to claim 13, wherein the wavelength of the second laser is one of i) 1.06 microns, ii) 532 nm, iii) 355 nm, and iv) 266 nm.

15. The method according to claim 9, wherein a wavelength of the first laser is between about 1.2 and 15 microns and a wavelength of the second laser is between about 1.06 microns and 193 nm.

16. The method according to claim 8, wherein the first laser beam is formed by a CO2 laser and the second laser beam is formed by other than a CO2 laser.

17. The method according to claim 8, wherein the first laser beam is formed by a CO2 laser and the second laser beam is formed by one of i) an Nd: YAG laser, ii) a Ti-sapphire laser, iii) a semiconductor diode laser iv) an Ar ion laser, and v) an Excimer laser.

18. The method according to claim 17, wherein the semiconductor diode laser is an AlGaAs laser.

19. The method according to claim 7, wherein the scribe lines have a depth no greater than a depth of the layer.

20. The method according to claim 7, wherein the substrate is silicon based and the layer over the substrate is other than silicon based.

21. A method for singulating a semiconductor substrate comprising the steps of:
    (a) aiming a first laser beam at a layer placed over a top surface of the substrate, the layer having a first absorption coefficient relative to a wavelength of the laser beam;
    (b) absorbing energy from the first laser beam into the layer based on the first absorption coefficient;
    (c) forming a first set of scribe lines in a first direction in the layer by scanning the first laser beam across the layer, the first laser beam removing at least a portion of the layer;

(d) forming a second set of scribe lines in a second direction in the layer by scanning the first laser beam across the layer and removing at least a portion of the layer with the first laser beam;

(e) aiming a second laser beam at the second set of scribe lines and cutting through the substrate along the first set of scribe lines with the second laser beam to form a respective first set of kerfs; and (f) aiming a second laser beam at the first set of scribe lines and cutting through the substrate along the second set of scribe lines with the second laser beam to form a respective second set of kerfs, wherein the substrate has a second absorption coefficient relative to the wavelength of the first laser beam, the second absorption coefficient less than the first absorption coefficient by about an order of magnitude.

22. The method according to claim 21, wherein the layer is a plurality of layers and the second absorption coefficient of the substrate is less than each respective absorption coefficient of the plurality of layers.

23. The method according to claim 21, wherein the second absorption coefficient is less than the first absorption coefficient by at least an order of magnitude.

24. A method for singulating a semiconductor substrate comprising the steps of:

(a) aiming a first laser beam at a layer placed over a top surface of the substrate;

(b) absorbing energy from the first laser beam into only the layer;

(c) forming a first set of scribe lines in a first direction in the layer by scanning the first laser beam across the layer, the first laser beam removing at least a portion of the layer;

(d) forming a second set of scribe lines in a second direction in the layer by scanning the first laser beam across the layer and removing at least a portion of the layer with the first laser beam, the second direction substantially orthogonal to the first direction;

(e) aiming a second laser beam at the top surface of the substrate;

(f) cutting through the substrate along the second set of scribe lines with the second laser beam; and (g) cutting through the substrate along the first set of scribe lines with the second laser beam, wherein the layer has a first absorption coefficient and the substrate has a second absorption coefficient relative to a wavelength from the laser beam, the first absorption coefficient greater than the second absorption coefficient.

25. The method according to claim 24, wherein the first absorption coefficient is greater than the second absorption coefficient by at least an order of magnitude.

26. A method for singulating a semiconductor substrate using a plurality of lasers, the method comprising the steps of:

(a) aiming a first laser of the plurality of lasers at a layer placed over a top surface of the substrate;

(b) absorbing energy from the first laser into the layer;

(c) forming a first set of scribe lines in a first direction in the layer by scanning the first laser across the layer, the first laser removing at least a portion of the layer;

(d) forming a second set of scribe lines in a second direction in the layer by scanning the first laser across the layer and removing at least a portion of the layer with the first laser, the second direction substantially orthogonal to the first direction;

(e) aiming a second laser of the plurality of lasers at the top surface of the substrate;

(f) cutting a first set of kerfs in the substrate with the second laser along the second set of scribe lines; and (g) cutting a second set of kerfs in the substrate with the second laser along the first set of scribe lines, wherein the layer has a first absorption coefficient and the substrate has a second absorption coefficient relative to a wavelength of the first laser, the first absorption coefficient greater than the second absorption coefficient by about an order of an order of magnitude, and the first set of kerfs and the second set of kerfs form a plurality of dice from the substrate.

27. The method according to claim 26, wherein the first absorption coefficient is greater than the second absorption coefficient by at least an order of magnitude.

28. A method for singulating a semiconductor substrate using a plurality of lasers, the method comprising the steps of:

(a) aiming the plurality of lasers over a top surface of the substrate;

(b) absorbing energy from a first laser of the plurality of lasers into the layer;

(c) forming a first scribe line in a first direction in the layer by scanning the first laser across the layer, the laser removing at least a portion of the layer;

(d) cutting a first kerf in the substrate with a second laser of the plurality of lasers along the first scribe line;

(e) forming a further first scribe line in the first direction in the layer over the substrate, the further scribe line substantially parallel to the first scribe line;

(f) cutting a further first kerf in the substrate with the second laser along the further first scribe line;

(g) repeating steps (e) and (f) in the first direction until the entire substrate is scribed and cut;

(h) forming a second scribe line in a second direction in the layer over the substrate by scanning the first laser across the layer and removing at least a portion of the layer, the second direction substantially orthogonal to the first direction;

(i) cutting a second kerf in the substrate with the second laser along the second scribe line;

(j) forming a further second scribe line in the second direction in the layer over the substrate, the further second scribe line substantially parallel to the second scribe line;

(k) cutting a further second kerf in the substrate with the second laser along the further second scribe line; and (l) repeating steps (j) and (k) in the second direction until the entire substrate is scribed and cut, wherein the layer has a first absorption coefficient and the substrate has a second absorption coefficient relative to a wavelength of the laser beam, the first absorption coefficient greater than the second absorption coefficient by about an order of magnitude, and the first kerf, the further first kerfs, the second kerf and the further second kerfs form a plurality of dice from the substrate.

29. The method according to claim 28, wherein the first absorption coefficient is greater than the second absorption coefficient by at least an order of magnitude.

30. The method according to claim 28, wherein the second laser is spaced apart from the first laser by a predetermined distance.

31. A method for singulating a semiconductor substrate using a plurality of lasers, the method comprising the steps of:

(a) aiming a first laser at a layer placed over a top surface of the substrate;

(b) forming a first set of scribe lines in a first direction in the layer by scanning the first laser across the layer, the first laser removing at least a portion of the layer;

(c) aiming a second laser at the top surface of the substrate;

(d) cutting a first set of kerfs in the substrate with the second laser along the first set of scribe lines;

(e) forming a second set of scribe lines in a second direction in the layer by scanning the first laser across the layer and removing at least a portion of the layer with the first laser;

(f) cutting a second set of kerfs in the substrate with the second laser along the second set of scribe lines, wherein the layer has a first absorption coefficient and the substrate has a second absorption coefficient relative to a wavelength of the laser beam, the first absorption coefficient greater than the second absorption coefficient by about an order of an order of magnitude, and the first set of kerfs and the second set of kerfs form a plurality of dice from the substrate.

32. The method according to claim 31, wherein the second direction substantially orthogonal to the first direction.

33. The method according to claim 31, wherein the second laser cuts through the substrate along the first and second kerfs.

34. An apparatus for singulating a semiconductor substrate having a coating layer thereon, the apparatus comprising:

a first laser placed over the coating layer of the substrate, the coating layer having a first absorption coefficient relative to a wavelength of the first laser and the semiconductor substrate having a second absorption coefficient less than the first absorption coefficient; and a second laser placed over a surface of the substrate, wherein energy from the first laser beam is absorbed into the coating layer based on a first absorption coefficient to form at least one scribe line therein, and the second laser cuts through the substrate along the at least one scribe line.

35. The apparatus according to claim 34, wherein the second absorption coefficient less than the first absorption coefficient by about an order of magnitude.

36. The apparatus according to claim 34, wherein the second absorption coefficient less than the first absorption coefficient by at least an order of magnitude.

37. The apparatus according to claim 34, wherein the first laser is a CO2 laser.

38. The apparatus according to claim 37, wherein the second laser is one of i) an Nd: YAG laser, ii) a Ti-sapphire laser, iii) a semiconductor diode laser, iv) an Ar ion laser, and v) an Excimer laser.

* * * * *

UNITED STATES PATENT AND TRADEMARK OFFICE
CERTIFICATE OF CORRECTION

PATENT NO. : 6,562,698 B2
DATED : May 13, 2003
INVENTOR(S) : Ran Manor

It is certified that error appears in the above-identified patent and that said Letters Patent is hereby corrected as shown below:

<u>Title page,</u>
Item [56], References Cited, U.S. PATENT DOCUMENTS, please insert:
"6/1999", the correct date is -- 7/1999 --.
-- 5,968,382    10/19/1999    Matsumota et al.
4,399,345    08/16/1983    Lapham et al. --
FOREIGN PATENT DOCUMENTS, please insert:
-- JP   58143553    08/1983
  JP   60167351    08/1985
  JP   56049539    05/1981
  WO 00/75983    12/2000 --

Signed and Sealed this

Fourteenth Day of October, 2003

JAMES E. ROGAN
*Director of the United States Patent and Trademark Office*